(12) United States Patent
Hiramatsu (10) Patent No.: US 6,654,702 B2
(45) Date of Patent: Nov. 25, 2003

(54) METHOD OF CHECKING VEHICLE MOUNTED ELECTRONIC UNITS

(75) Inventor: Shinya Hiramatsu, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 14 days.

(21) Appl. No.: 09/911,546

(22) Filed: Jul. 25, 2001

(65) Prior Publication Data

US 2002/0035420 A1 Mar. 21, 2002

(30) Foreign Application Priority Data

Jul. 26, 2000 (JP) ........................................ 2000-225268

(51) Int. Cl.$^7$ ................................................ G06F 7/00
(52) U.S. Cl. ........................ 702/124; 702/117; 701/29; 701/36
(58) Field of Search ................................ 702/119, 124, 702/125, 126, 117, 118, 120, 121, 122, 123; 701/29, 32, 33, 35; 714/718

(56) References Cited

U.S. PATENT DOCUMENTS

| | | | | |
|---|---|---|---|---|
| 4,234,921 A | * | 11/1980 | Kinoshita et al. | 701/99 |
| 4,521,879 A | * | 6/1985 | Gueldenpfennig et al. | 370/267 |
| 4,924,391 A | * | 5/1990 | Hirano et al. | 701/33 |
| 5,056,023 A | * | 10/1991 | Abe | 701/32 |
| 5,189,617 A | * | 2/1993 | Shiraishi | 701/48 |
| 5,896,418 A | * | 4/1999 | Hamano et al. | 375/259 |
| 6,256,557 B1 | * | 7/2001 | Avila et al. | 701/1 |
| 6,279,531 B1 | * | 8/2001 | Robichaux et al. | 123/339.19 |
| 6,321,148 B1 | * | 11/2001 | Leung | 701/29 |
| 6,321,150 B1 | * | 11/2001 | Nitta | 701/29 |

FOREIGN PATENT DOCUMENTS

| | | | | |
|---|---|---|---|---|
| JP | 63102433 | | 5/1988 | H04L/13/00 |
| JP | 3-104459 | | 5/1991 | H04L/29/08 |

OTHER PUBLICATIONS

English Language Abstract of JP 63–102433.
English Language Abstract of JP 3–104459.

* cited by examiner

Primary Examiner—Hal Wachsman
Assistant Examiner—Jeffrey R West
(74) Attorney, Agent, or Firm—Greenblum & Bernstein, P.L.C.

(57) ABSTRACT

An electronic unit mounted in a vehicle includes a controller unit. The electronic unit is tested by a test device using periodic communications cycled therebetween. A frame of order signal is formulated by loading data designating several ports and transmitted from the test device to the controller unit. The controller unit processes the order signal and returns the processed results to the test device. At least part of the above data are shortened from 8 bits to 4 bits, and several ports are tested in one cycle of the periodic communications. The testing time is thus reduced for the electronic unit.

20 Claims, 9 Drawing Sheets

| ID | DATA1 | DATA2 | C/S |
|---|---|---|---|

FIG.4 PRIOR ART

| ID | DATA1 | DATA2 | DATA3 | C/S |
|---|---|---|---|---|

FIG.5 PRIOR ART

| ID | | DATA1 | | DATA2 | | C/S | |
|---|---|---|---|---|---|---|---|
| 0000 | 0001 | **** | **** | 0000 | 0000 | **** | **** |

8bit (under DATA1)

FIG.6 PRIOR ART

| ID | | DATA1 | | DATA2 | | DATA3 | | C/S | |
|---|---|---|---|---|---|---|---|---|---|
| 0000 | 0001 | **** | **** | **** | **** | 0000 | 0000 | **** | **** |

8bit (under DATA1)   8bit (under DATA2)

FIG.7 PRIOR ART

| ID | | DATA1 | | DATA2 | | C/S | |
|---|---|---|---|---|---|---|---|
| 0000 | 0011 | **** | **** | **** | **** | **** | **** |
| | | 8bit | | 8bit | | | |

FIG.8 PRIOR ART

| ID | | DATA1 | | DATA2 | | DATA3 | | C/S | |
|---|---|---|---|---|---|---|---|---|---|
| 0000 | 0011 | **** | **** | **** | **** | **** | **** | **** | **** |
| | | 8bit | | 8bit | | 8bit | | | |

FIG.9 PRIOR ART

| ID | | DATA1 | | DATA2 | | C/S | |
|---|---|---|---|---|---|---|---|
| 0000 | 0100 | **** | **** | **** | **** | **** | **** |
| | | 8bit | | 8bit | | | |

FIG.10 PRIOR ART

| ID | | DATA1 | | DATA2 | | DATA3 | | C/S | |
|---|---|---|---|---|---|---|---|---|---|
| 0000 | 0100 | **** | **** | **** | **** | 0000 | 0000 | **** | **** |
| | | 8bit | | 8bit | | | | | |

| ID | DATA1 | DATA2 | DATA3 | DATA4 | DATA5 | DATA6 | DATA7 | DATA8 | DATA9 | C/S | |
|---|---|---|---|---|---|---|---|---|---|---|---|
| 0010 | **** | **** | **** | 0000 | 0000 | 0000 | 0000 | 0000 | 0000 | **** | **** |

↑11

DATA1: 4bit, DATA2: 4bit, DATA3: 4bit

FIG.13

| ID | DATA1 | DATA2 | DATA3 | DATA4 | DATA5 | DATA6 | DATA7 | DATA8 | DATA9 | C/S | |
|---|---|---|---|---|---|---|---|---|---|---|---|
| 0011 | **** | **** | **** | **** | **** | 0000 | 0000 | 0000 | 0000 | **** | **** |

↑12

DATA1: 4bit, DATA2–DATA3: 8bit, DATA4–DATA5: 8bit

METHOD OF CHECKING VEHICLE MOUNTED ELECTRONIC UNITS

BACKGROUND OF THE INVENTION

1. Field of the Invention

The present invention relates to a method of checking electronic units mounted in a vehicle, e.g., a car. The invention also concerns a system for performing the above method.

2. Description of Background Information

Recent years have witnessed a remarkable development in the field of motor vehicle electronics. At the same time, electronic units mounting on board vehicles now call for larger scale circuitry. Microcomputer chips (e.g., microprocessors or microcontrollers) 2 are now thus commonly mounted into vehicle-mounted electronic units 1 (note FIG. 1). Such a microcomputer chip 2 can function as a controller unit operative on various controlled systems (not shown in the figures).

Figure 1:
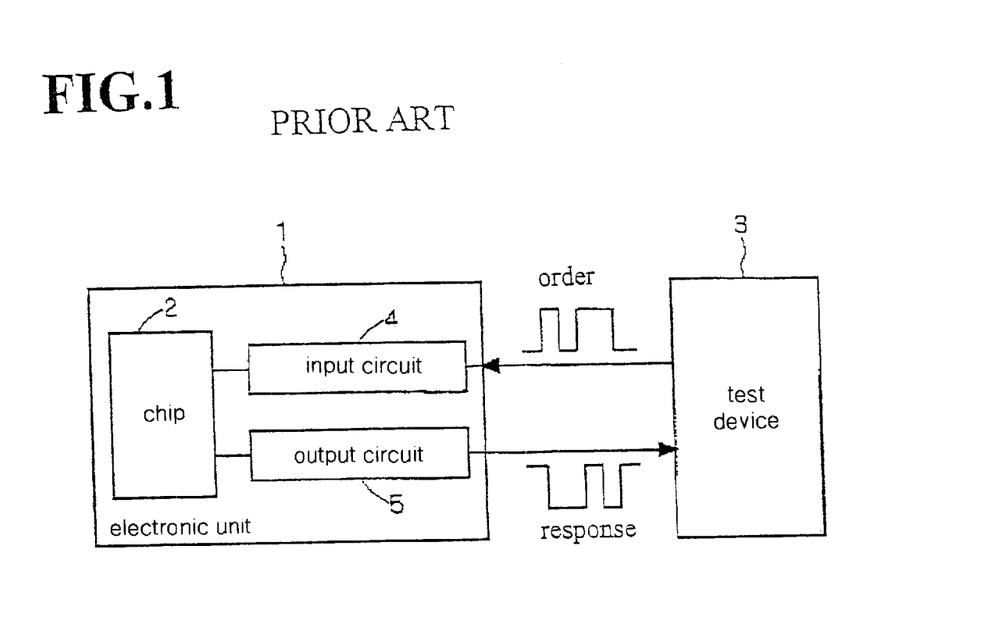
FIG. 1 is a block diagram showing how an electronic unit to be loaded in a vehicle is connected to a test device.

Such a microcomputer chip 2 typically includes programs for proper car functioning, and programs specifically developed for internal checking. When it is operational in the vehicle, the programs for vehicle control functions are launched, whereas when circuits are to be inspected, the checking programs for checking are started.

When the vehicle is running, the programs for checking must be prevented from starting. For this purpose, the checking programs are designed such that they can be started only by inputting complex logic combinations at the microcomputer, the combination being chosen such that it does not occur during normal operation. For instance, if an ignition key is not inserted into an ignition socket, an ignition switch would not be expected to be turned in the car. Accordingly, the programs for checking may be designed so that they can start only when a detection signal for the inserted ignition key is active and the ignition switch is also turned on (i.e., the ignition key is inserted and rotated). In this manner, the programs for checking may not be triggered while the car is running. As shown in FIG. 1, an order signal may indicate e.g., that both the signal for detecting the inserted ignition key and the ignition switch are turned on. The signal order thus gives instruction to a test routine, and is delivered from a test device 3 to an ignition input circuit 4 (IG input circuit) contained in an electronic unit 1 for cars. The test device 3 may e.g., be a system for testing at the factory before shipment. Subsequently, the microcomputer chip 2 functions according to a program specific to a test to be performed. The microcomputer chip 2 then returns a response signal to the test device 3 via an output circuit e.g. a courtesy lamp driving circuit (courtesy LP driving circuit) 5. The test device 3 can thus perform function tests, so as to determine whether the microcomputer chip 2 functions well and the input and output circuits work normally. Various input circuits, such as an ignition input circuit 4, and output circuits such as a courtesy lamp driving circuit 5, are commonly used in car electronic units. Consequently, these common circuits require no other specific equipment for testing.

Figure 2:
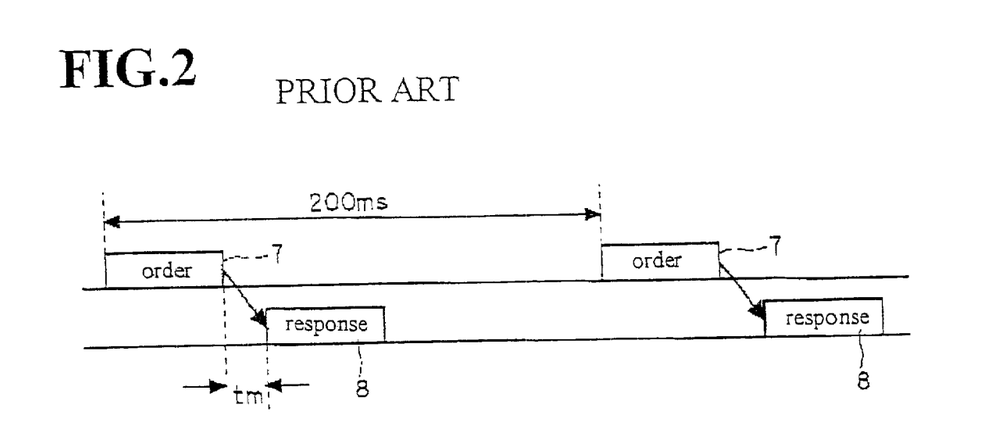
FIG. 2 is a chart showing a timing when an order signal and a response signal are transmitted at a given periodicity.

The above test method employs a serial communications system including the test device 3 as a master system and the electronic unit 1 as a slave system. As shown in FIG. 2, communications are periodically sent from the test device 3 to the electronic unit 1 at a rate of 200 ms, irrespective of the presence or absence of an order (i.e., an instruction indicating whether a car-running program or a test program is launched). When an order is effectively to be given, an order signal 7 is loaded on a periodically passing communication. When an initial state (i.e., both the car-running programs and the test programs are put to rest) is to be maintained, an order signal indicating "no reference" is sent. When the order signal 7 is given, the microcomputer chip 2 is designed so as to output a response signal 8 after a processing time of tm (within the limit of 10 ms).

The tests for the functioning of the electronic unit 1 are thus performed by using a test device 3, and carried out at the last step of the production process for the car electronic unit 1. The larger the scale of the circuits in the electronic unit 1, the greater is the test time. Therefore, although the serial communication system is applied, the processing time for the electronic unit 1 tends to increase, and creates a production problem.

Figure 3:
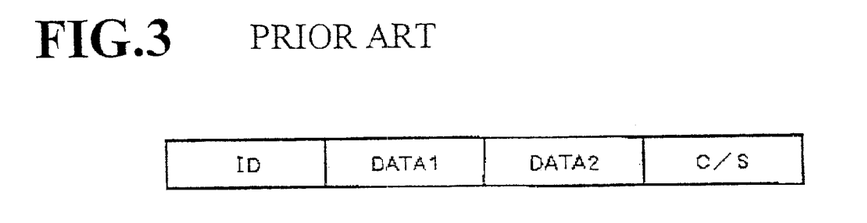
FIG. 3 shows a format for a known order signal.
Figure 4:
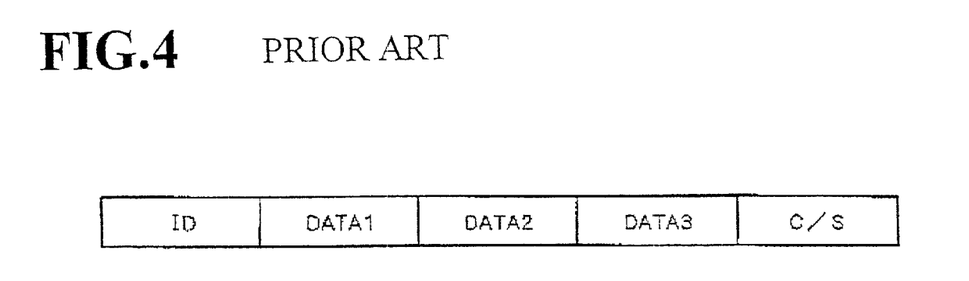
FIG. 4 shows a format for a known response signal.

FIGS. 3 and 4 show signal formats used in communications protocols in a known periodically performed transmission. Specifically, FIG. 3 shows a format for order signal sent from the test device 3 to the electronic unit 1, whereas FIG. 4 shows a format for response signal sent from the electronic unit 1 to the test device 3.

In the above two figures, reference ID indicates 8 bit data (B7~B0) giving orders, the contents of which are explained in Table 1.

TABLE 1

| Test mode | B7 | B6 | B5 | B4 | B3 | B2 | B1 | B0 | Hexa-decimal code |
|---|---|---|---|---|---|---|---|---|---|
| No test | 0 | 0 | 0 | 0 | 0 | 0 | 0 | 0 | 00 |
| Return the check sums calculated by μ-computer | 0 | 0 | 0 | 0 | 0 | 0 | 0 | 1 | 01 |
| Read-out the state on SW input from common ports | 0 | 0 | 0 | 0 | 0 | 0 | 1 | 0 | 02 |
| Read-out the value from A/D ports | 0 | 0 | 0 | 0 | 0 | 0 | 1 | 1 | 03 |
| Write-in the output from common ports | 0 | 0 | 0 | 0 | 0 | 1 | 0 | 0 | 04 |
| Modify the periodicity of W/D pulses | 0 | 0 | 0 | 0 | 0 | 1 | 0 | 1 | 05 |
| End of the test mode | 1 | 1 | 1 | 1 | 1 | 1 | 1 | 1 | FF |

In the above table, the common ports signify the ports common for input and output. The A/D ports signify analog/digital ports, through which voltages are measured, converted into digital terms and read out. The W/D pulses (watchdog pulses) are generated by integrated circuits provided beside the microcomputer, and watch out for malfunctions in the microcomputer.

The data contained in the formats shown in FIGS. 3 and 4 define order contents, as explained below. When ID contains digits "0000 0000" ("00" in the hexadecimal code), no test is performed. When ID contains digits "0000 0001" ("01", ibid.), checksum values (C/S) calculated by the microcomputer chip 2 are requested to be returned. When ID contains digits "0000 0010" ("02", ibid.), the input data concerning a switch (SW) for common port are read out. When ID contains digits "0000 0011" ("03", ibid.), the data at A/D ports are read-out. When ID contains digits "0000 0100" ("04", ibid.), the output from a common port is written-in. When ID contains digits "0000 0101" ("05", ibid.), the periodicity of W/D pulses is modified. When ID contains digits "1111 1111" ("FF", ibid.), the test mode is terminated.

In FIGS. 3 and 4, reference "DATA 1" stores data designating port numbers.

For instance, when reading out the data regarding switch input for common ports (when ID is "0000 0010" in Table 1), DATA 1 includes 8-bit data which designate a port, from which the state on switch input are read out. When reading out data from A/D ports (when ID is "0000 0011" in Table 1), DATA 1 includes 8-bit data which designate a port, from which A/D values are read out. When writing-in output from common ports (when ID is "0000 0100" in Table 1), DATA 1 includes 8-bit data which designate a port, from which the output is written in.

Further in FIGS. 3 and 4, DATA 2 and DATA 3 are supplied with different data, depending on test contents.

Figure 5:
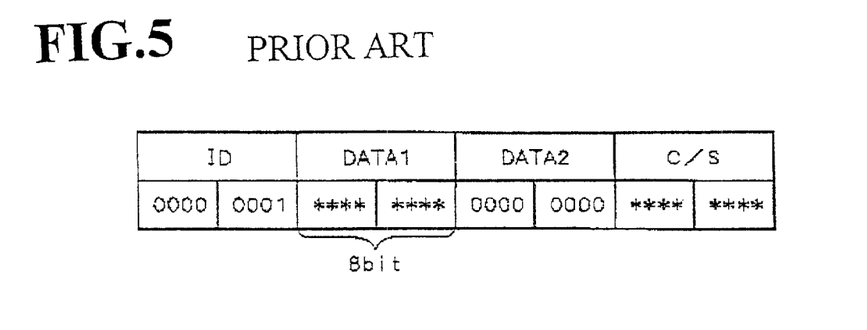
FIG. 5 shows a known order signal for reading-out the input data on SW at common ports.
Figure 6:
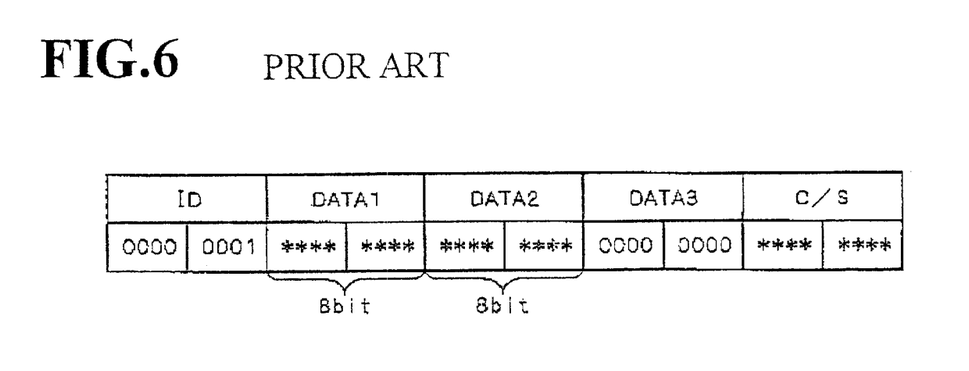
FIG. 6 shows a known response signal for reading-out the input data on SW at common ports.

When reading out information on switch input for common ports (when ID is "0000 0010" in Table 1), an order signal shown in FIG. 3 does not use DATA 2, so that all 8 bits of DATA 2 are supplied with a bit "0" (FIG. 5). In a response signal (FIG. 4) to such an order signal, DATA 2 is supplied, bit by bit, with a high-level/a low-level state of each of 8 terminals No. 0 to 7 contained in the port, which is designated by "DATA 1" for reading out the state on switch input (see FIG. 6). In the eight bits of "DATA 2" in FIG. 6, terminal No. 0 corresponds to the lowest bit level, while terminal No. 7 corresponds to the highest bit level. For instance, the port from which the input state regarding the switch is read out may be allocated port No. 1 ("0000 0001"), and only terminal No. 0 of this port may be put in a high state. Then, "DATA 1" of the response signal is defined by bits "0000 0001", and "DATA 2" is defined by bits "0000 0001". Likewise, the port, from which the input state regarding the switch is read out, may be allocated port No. 3 ("0000 0011"), and only terminal No. 1 in this port may be put in a high state. Then, "DATA 1" of the response signal is defined by bits "0000 0011", while "DATA 2" thereof is defined by bits "0000 0010. "DATA 3" of the response signal of FIG. 6 is not used, so that all the bits thereof are supplied with a bit "0".

Figure 7:
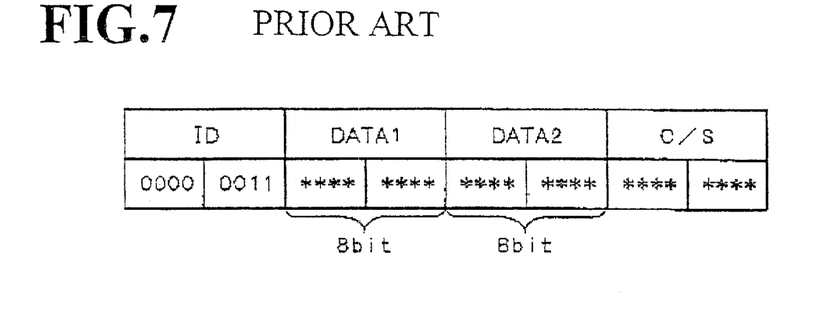
FIG. 7 shows a known order signal for reading-out the value at A/D ports.
Figure 8:
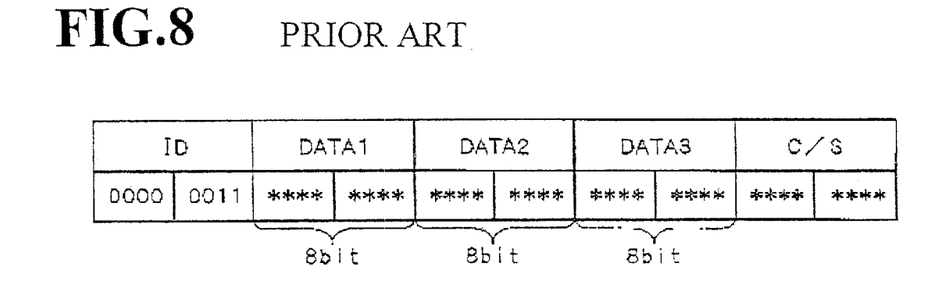
FIG. 8 shows a known response signal for reading-out the value at A/D ports.

Further, when reading-out data from A/D ports (when ID is "0000 0011" in Table 1), "DATA 1" in the order signal of FIG. 3 designates a port from which A/D values are read out. Likewise, "DATA 2" designates a terminal from which A/D values are read-out (FIG. 7). In "DATA 2", terminal No. 0 corresponds to the lowest bit level, while terminal No. 7 corresponds to the highest bit level. For instance, the port from which A/D values are read out has port No. 1 ("0000 0001), and only the A/D values of terminal No. 0 in this port are read out. Then, "DATA 1" of the order signal is housed with bits "0000 0001", while "DATA 2" thereof is defined by bits "0000 0001". In another example, the port from which A/D values are read out has port No. 3 ("0000 0011"), and only the A/D values of terminal No. 1 in this port are read out. Then, "DATA 1" of the order signal is defined by bits "0000 0011", while "DATA 2" thereof is defined by bits "0000 0010". The same can be said for "DATA 2" of the response signal of FIG. 8, corresponding to the order signal of FIG. 7. Furthermore, "DATA 3" in the response signal of FIG. 8 is defined by 8-bit A/D values, which are read out from the terminal designated by "DATA 2", the terminal being included in the port designated by "DATA 1".

Figure 9:
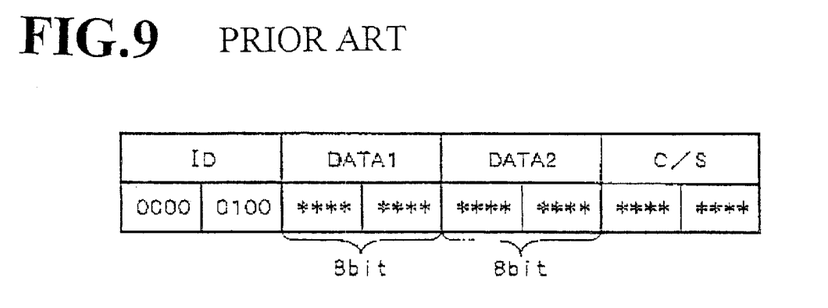
FIG. 9 shows a known order signal for writing-in the output from common ports.
Figure 10:
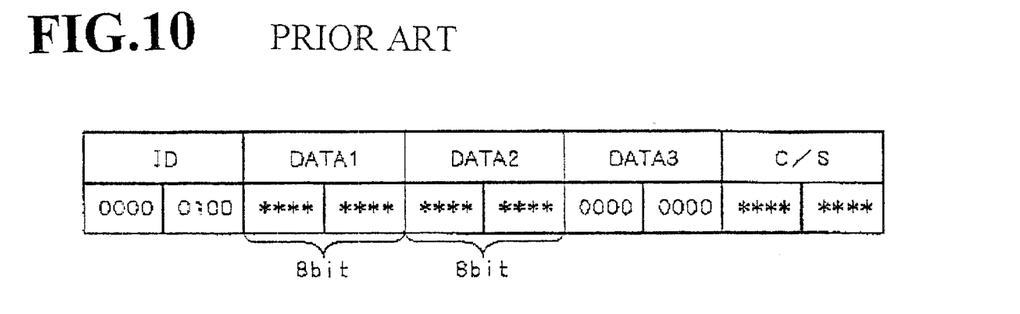
FIG. 10 shows a known response signal for writing-in the output from common ports.

Further, when writing in from the output from common ports (when ID is "0000 0100" in Table 1), "DATA 2" in the order signal of FIG. 3 is defined by an 8-bit content, which is intended to be written into the microcomputer chip 2 (see FIG. 9). In the response signal of FIG. 4 to such order signal, "DATA 2" of FIG. 10 is supplied with 8-bit data written in to the microcomputer chip 2 and outputted. In the same response signal of FIG. 10, "DATA 3" is not used, so that all the bits thereof are stored with a bit "0".

Reference "C/S" in FIGS. 3 to 10 signifies check sum data. In the order signals shown in FIGS. 12, 14, 16 and 18, items "ID", "DATA 1" and "DATA 2" are added, and the resulting lowest 8 bit data (i.e., value excluding the figures overflowing from 8 bits) are stored. In the response signals (FIGS. 13, 15, 17 and 19), items "ID", "DATA 1", "DATA 2" and "DATA 3" are added, and the resulting lowest 8 bit data are stored.

As can be understood from the foregoing past practice, all data covering "ID" and "DATA 1" to "DATA 3" are processed as 8-bit data. Accordingly, one frame of order signal (FIGS. 12, 14, 16 or 18) could process only one port for reading out the input state regarding the switch, one terminal for reading out the A/D values and one port for writing in from the output of common ports. Likewise, one frame of the response signals (FIGS. 13, 15, 17 and 19) could process only for the same number of terminal and ports as in the corresponding order signals. If one frame of order signal or response signal can handle a greater number of ports and terminals, the processing time may be minimized. Such a system configuration will then better cope with an ever increasing circuit scale of electronic units.

SUMMARY OF THE INVENTION

One object of the present invention is therefore to provide a method of testing a vehicle mounted electronic unit, in which one frame of order signal and one frame of response signal can process a greater number of ports and terminals, so that the overall processing time can be reduced.

To this end, there is provided a method of testing an electronic unit mountable in a vehicle, the method utilizing a test device and a controller unit included in the electronic unit, an order signal being supplied from the test device to the controller unit, and processed therein to give processed results; the latter being returned from the controller unit to the test device as a response signal. The above method includes providing, in the test device, first data designating several ports and several terminals contained in the controller unit, as well as second data instructing an order content relative to each of the ports and terminals, and providing the first and second data in a frame of order signal, thereby formulating an order signal containing order contents; periodically transmitting the order signal from the test device to the controller unit, frame by frame, at a given frequency; processing the order contents corresponding to each of the ports and terminals contained in the order signal, when the order signal is received by the controller unit, thereby obtaining processed results; providing, in the controller unit, the processed results for each of the ports and terminals in a frame of response signal; and periodically returning the response signal from the controller unit to the test device, frame by frame, at the given frequency.

Preferably, the second data have a data length of 4 bits.

Preferably yet, the first data have a data length of 4 bits.

Typically, providing the first data includes providing an order signal containing third data designating a single port and having a data length of 4 bits, and several terminals, as well as fourth data instructing an order content relative to each of the terminals, and providing first and second data further includes providing said third and fourth data in a frame of order signal.

In the above method, the providing the processed results includes providing a response signal containing the same data as the first and second data in the order signal.

The invention further concerns a system for testing an electronic unit mountable in a vehicle, the system containing a test device and a controller unit included in the electronic unit, an order signal being supplied from the test device to the controller unit, and processed therein to give processed results; the latter being returned from the controller unit to the test device as a response signal. The above system includes a first device that provides, in the test device, first data designating several ports and several terminals contained in the controller unit, as well as second data instructing an order content relative to each of the ports and terminals, and that provides the first and second data in a frame of order signal, such as to formulate an order signal containing order contents; a transmitter that periodically transmits the order signal from the test device to the controller unit, frame by frame, at a given frequency; a processor that processes the order contents corresponding to each of the ports and terminals contained in the order signal, when the order signal is received by the controller unit, such as to obtain processed results; a second device that provides, in the controller unit, the processed results for each of the ports and terminals in a frame of response signal; and a third device that periodically returns the response signal from the controller unit to the test device, frame by frame, at the given frequency.

Preferably, the second data in the first device have a data length of 4 bits.

Preferably yet, the first data in the first device have a data length of 4 bits.

Suitably, the first device includes an order signal provider that provides an order signal containing third data designating a single port and having a data length of 4 bits, and several terminals, as well as fourth data instructing an order content relative to each of the terminals, and the order signal provider further includes a signal provider that provides the third and fourth data in a frame of order signal.

Typically, the second device has a response signal provider that provides a response signal containing the same data as the first and second data in the order signal.

BRIEF DESCRIPTION OF THE DRAWINGS

The above, and the other objects, features and advantages of the present invention will be made apparent from the following description of the preferred embodiments, given as non-limiting examples, with reference to the accompanying drawings, in which:

FIGS. 15(a) and (b) show a format for response signal used in the prior art and in the present invention, respectively;

DETAILED DESCRIPTION OF THE PREFERRED EMBODIMENTS

In a method of testing an electronic unit to be loaded in a vehicle, such as a car according to a first embodiment of the invention, four-bit data are processed between an electronic unit 1 and a test device 3, instead of eight bit data handled in the past. As the data length is halved, one frame of order signal and of response signal can carry a greater number of ports and of terminals. Consequently, one processing cycle can handle several treatments, and the overall processing time can be reduced.

<Order Signals>

Figure 11A:
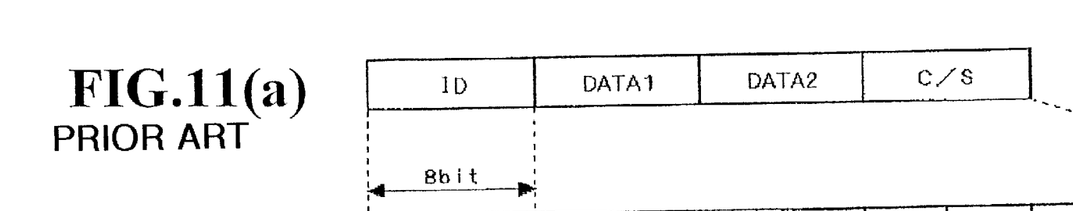
FIGS. 11(a) and (b) show a format for order signal used in the prior art and in the present invention, respectively.
Figure 11B:
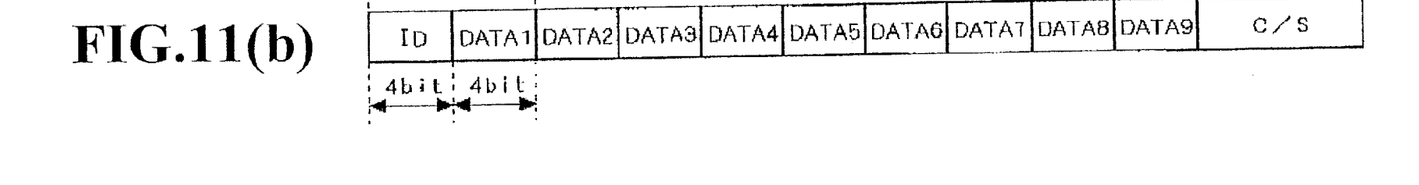

In FIG. 11, a format for order signal according to the present embodiment (FIG. 1(b)) and one known in the prior art (FIG. 1(a)) are compared.

In the present embodiment, the order format contains data with a fixed length of 48 bits. It includes item "ID" for indicating an order content, and items "DATA 1" to "DATA 9" for designating, inter alia, a port number. Each of these items contains data having a four-bit length. To these items is added item "check sum (C/S)" having a eight bit length.

The item "ID" indicates data having 4 bits (B3 to B0), and contains order contents mentioned in Table 2

TABLE 2

| Test mode | ID | | | | Hexa-decimal code |
| --- | --- | --- | --- | --- | --- |
| | B3 | B2 | B1 | B0 | |
| No test | 0 | 0 | 0 | 0 | 0 |
| Return the C/S values calculated by μ-computer | 0 | 0 | 0 | 1 | 1 |
| Read-out the data on SW input from common ports | 0 | 0 | 1 | 0 | 2 |
| Read-out the values from A/D ports | 0 | 0 | 1 | 1 | 3 |
| Write-in from the output of common ports | 0 | 1 | 0 | 0 | 4 |
| Modify the periodicity of W/D pulses | 0 | 1 | 0 | 1 | 5 |
| End of the test mode | 1 | 1 | 1 | 1 | F |

As shown in Table 2, orders given in order signal "ID" contain seven types, including "no test" and "end of the test mode".

As a rule, when an occurrence probability of an event "a" is defined as P (a), an information volume I (a) of the data for transmitting the event "a" in distinction from the other events can be represented by the formula (I):

$$I(a) = -\log_2 P(a) \quad (I)$$

As the number of events (number of types of order contents) shown in Table 2 is seven, the occurrence probability P (a) of the order content "a" is ⅐. Then, the information volume I (a) of "ID" for discriminating the order content "a" can be represented by the formula (II):

$$-\log_2(1/7) = \log_2 7 = 2.804 \text{ bit} < 3 \text{ bit} \quad (II)$$

Accordingly, when "ID" is secured to have a data length of at least 3 bits, seven order contents can be distinguished. In the present embodiment, "ID" is actually secured with a 4-bit data length.

In the format of order signal of FIG. 11(b), when "ID" is "0000" ("0" according to the hexadecimal code), no test is carried out. When "ID" is "0001" ("1", ibid.), return of the check sum value (C/S) given by the microcomputer chip 2 (controller unit) is required. When "ID" is "0010" ("2", ibid.), switch (SW)-relating input data are read out from common ports. When "ID" is "0011" ("3", ibid.), data are read out from A/D ports. When "ID" is "0100" ("4", ibid.), the output from common ports is written in. When "ID" is "0101" ("5", ibid.), the periodicity of W/D pulses is modified. When "ID" is "1111" ("F", ibid.), the test mode is terminated.

As to designating port numbers, it is to be noted that a practically used microcomputer chip 2 contains around five ports only. The data having a 4 bit length can therefore designate distinctively those port numbers, according to the formula (I).

Figure 12:
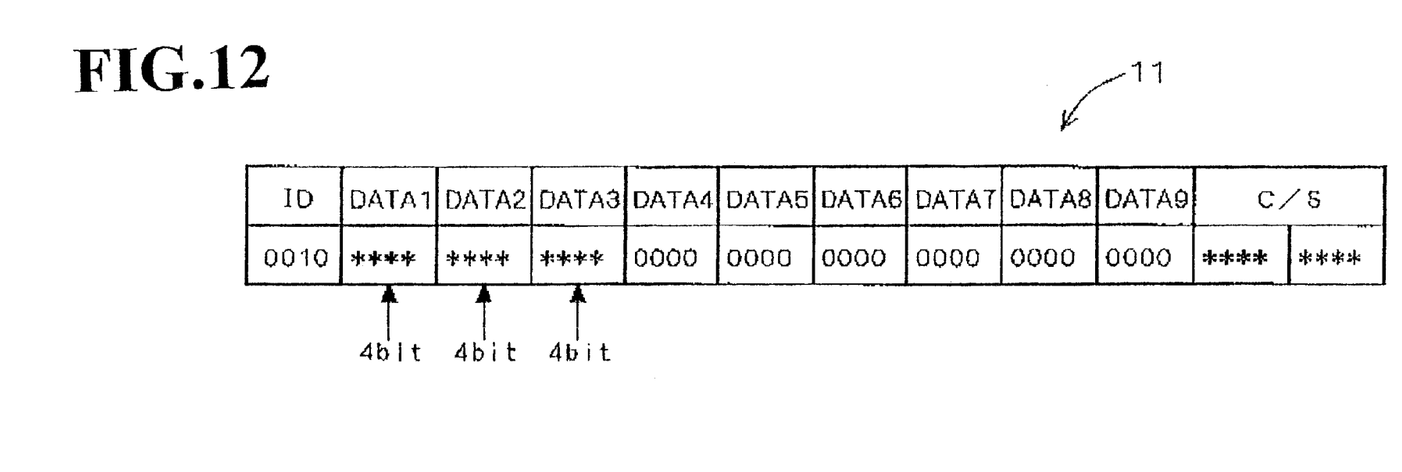
FIG. 12 shows a format for order signal for reading-out the state on SW input from common ports according to the present invention.

For instance, when the SW input data are read out from common ports (when "ID" is "0010" in Table 2), "DATA 1" to "DATA 3" in the order signal of FIG. 11(b) are housed respectively with 4-bit data for designating the port through which SW input state is to be read out, as shown in order signal 11 in FIG. 12. In this embodiment, "DATA 4" to "DATA 9" are not used, so that all the 4 bits of each data are defined by a digit "0".

Figure 13:
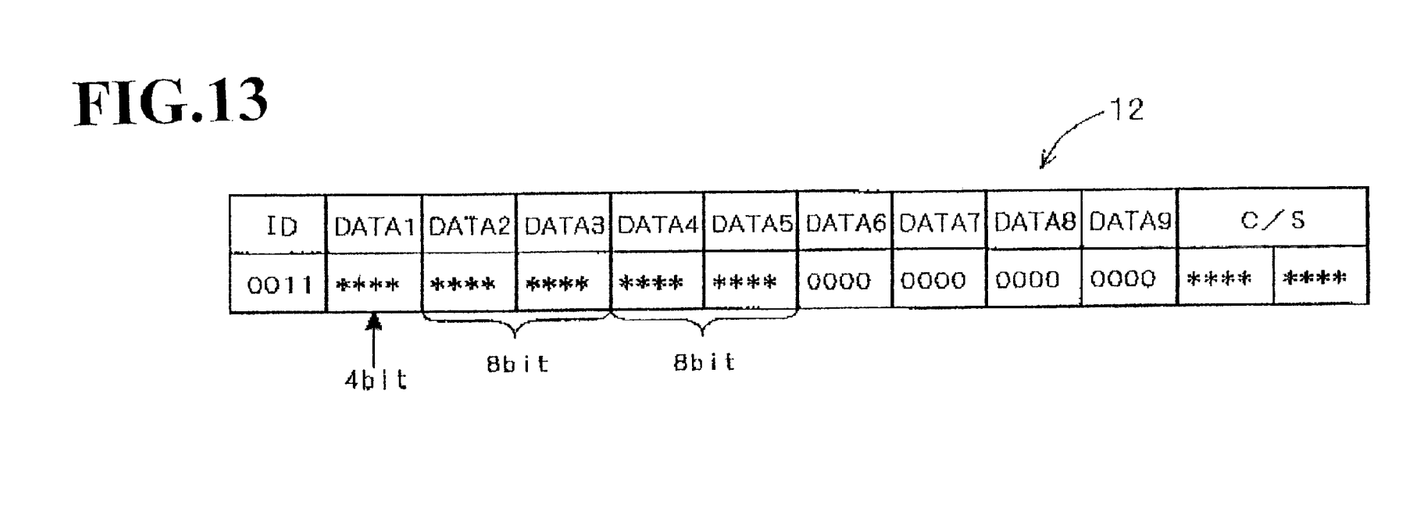
FIG. 13 shows a format for order signal for reading-out the data from A/D ports according to the present invention.

When the data are read out from A/D ports (when "ID" is "0011" in Table 2), "DATA 1" in the order signal 12 of FIG. 13 contains 4-bit data designating the port number for reading out the A/D value. Further, "DATA 2" and "DATA 3" are combined and processed as 8-bit data, and form a flag for designating a terminal in the port for reading out the A/D value, the port being designated by "DATA 1". Likewise, "DATA 4" and "DATA 5" are combined and processed as 8-bit data, and form a flag for designating another terminal in the port for reading out the A/D value, the port being designated by "DATA 1". In the 8-bit data of the combined "DATA 2" and "DATA 3" and those of the combined "DATA 4" and "DATA 5", terminal No. 0 corresponds to the lowest bit level, while terminal No. 7 corresponds to the highest bit level. For instance, when the terminals Nos. 0 and 1 in read-out port No. 1 ("0001") are to be designated, "DATA 1" of the order signal 12 are provided with bits "0001", while "DATA 2" and "DATA 3" thereof are respectively provided with bits "0000" and "0001", forming thus combined 8-bit data of "0000 0001". Then, "DATA 4" and "DATA 5" are respectively provided with bits "0000" and "0010", forming thus combined 8-bit data of "0000 0010". "DATA 6" to "DATA 9" are not used, so that all the 4 bits included therein are provided with a bit"0", as shown in FIG. 13.

Figure 14:
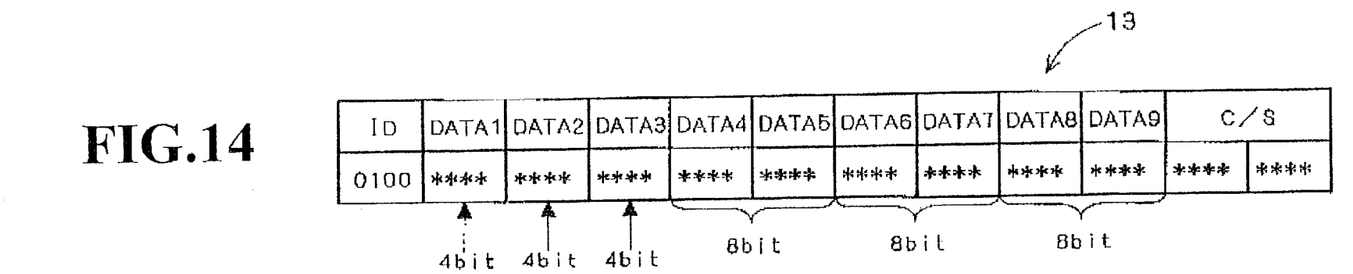
FIG. 14 shows a format for order signal for writing-in the output from common ports according to the present invention.

When the output from common ports is to be written in (when "ID" is "0100" in table 2), "DATA 1" to "DATA 3" in the order signal of FIG. 11(b) contain corresponding 4-bit data designating the number of ports for writing in from the output, as shown in the order signal 13 of FIG. 14. "DATA 4" and "DATA 5" are combined and processed as 8-bit data as shown in FIG. 14, and are supplied with a port output content in 8 bits, which are intended to be written into the output writing-in port designated by "DATA 1". Likewise, "DATA 6" and "DATA 7" are combined and processed as 8-bit data as shown in FIG. 14, and are supplied with a port output content in 8 bits, which are intended to be written into the output writing-in port designated by "DATA 2". Further, "DATA 8" and "DATA 9" are combined and processed as 8-bit data as shown in FIG. 14, and are supplied with a port output content in 8 bits, which are intended to be written into the output writing-in port designated by "DATA 3".

Item "C/S" in FIGS. 11 to 14 indicate check sum data. In the order signals 11 to 13, 8 bit data combining, respectively, items "ID" and "DATA 1", items "DATA 2" and "DATA 3", items "DATA 4" and "DATA 5", items "DATA 6" and "DATA 7", and items DATA 8 and DATA 9 are all added as 8-bit data. Then, the lowest 8-bit data (i.e., values excluding overflowed higher figures) are housed.

The order signals 11 to 13 are produced in the test device 3 shown in FIG. 1, periodically transmitted to an electronic unit 1 for car loading at a 200 ms periodicity. The order signals are inputted into a microcomputer chip 2 via an IG input circuit, both contained inside the electronic unit 1.

<Response Signal>

Figures 15A, 15B:
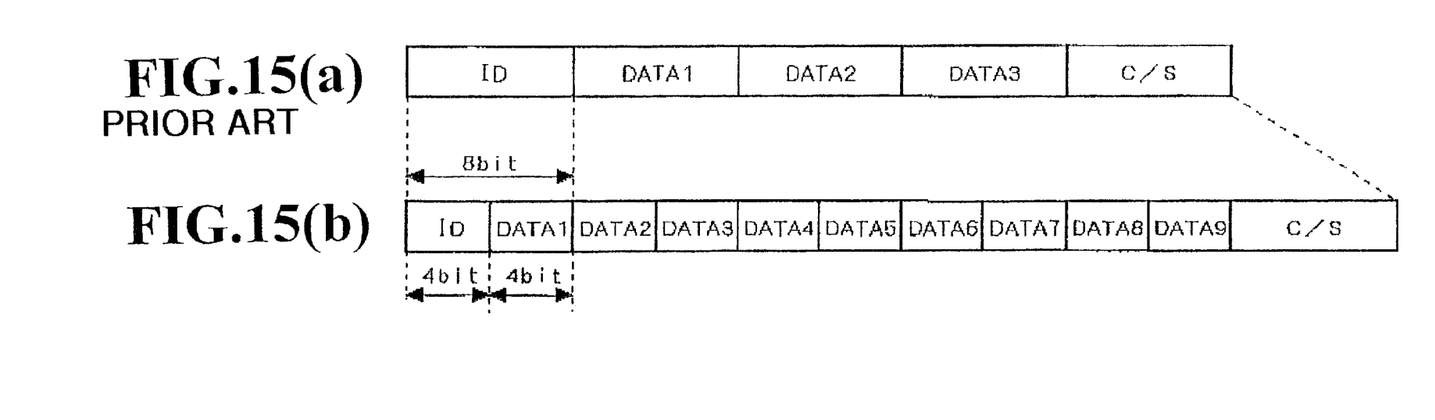

The microcomputer chip 2 shown in FIG. 1 produces a response signal in reply to a given order signal, and transmits it periodically to the test device 3 via a courtesy lamp LP driving circuit 5. FIG. 15(a) shows a format for response signals known in the prior art, while FIG. (b) shows a format for response signals used in the present embodiment of the invention.

The format for the response signals of the present embodiment is essentially the same as that for the order signals having a fixed data length of 48 bits. It contains item "ID" indicating a response content (same as the order content), and "DATA 1" to "DATA 9" each having a data length of 4 bits and designating, inter alia, port numbers. It further contains item "C/S" (check sum data) having a data length of 8 bits.

"ID" includes a 4 bit data (B3 to B0) signifying the same order contents as shown in Table 2. In the format for response signals of FIG. 15(b), no test is carried out when "ID" is "0000" ("0" according to the hexadecimal code). When "ID" is "0001" ("1", ibid.), the order content indicates a request for "return transmission of check-sum values". When "ID" is "0010" ("2", ibid.), the order content indicates "read out the input data on SW for common ports". When "ID" is "0011" ("3", ibid.), the order content indicates "read out the A/D port data". When "ID" is "0100" ("4", ibid.), the order content indicates "write in the common port output". When "ID" is "0101" ("5", ibid.), the order content indicates "modify the W/D pulse periodicity". When "ID" is "1111" ("F", ibid.), the order content indicates "terminate the test mode".

Figure 16:
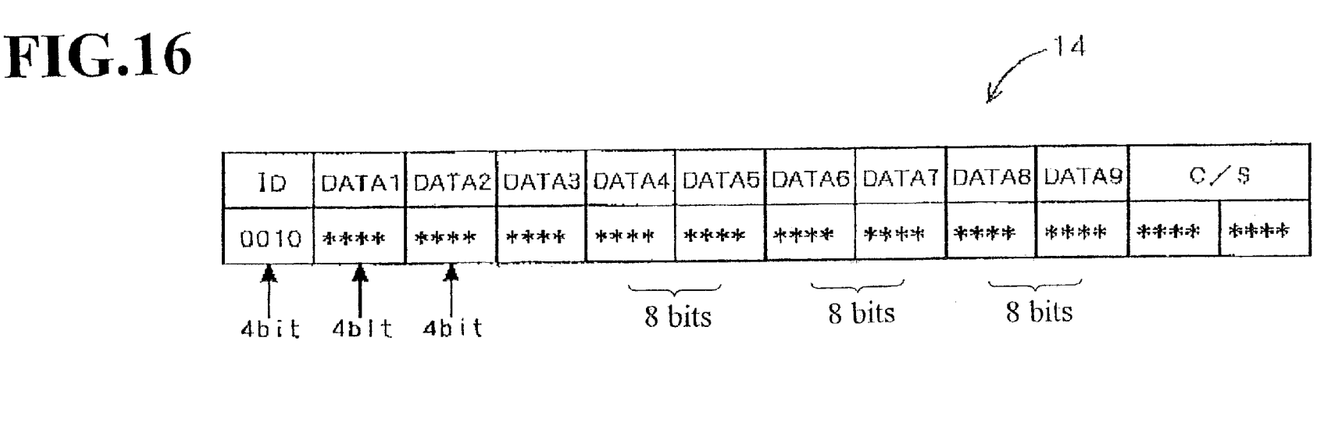
FIG. 16 shows a format for response signal for reading-out the state on SW input from common ports according to the present invention.

When reading out the switch input data for common port switch ("ID" is "0010" in Table 2), "DATA 1" to "DATA 3" in the response signals of FIG. 15(b) respond to the order signals 11 of FIG. 12, and are supplied respectively with 4-bit data designating the port for reading out SW input state, as shown in the response signals 14 of FIG. 16. Meanwhile, "DATA 4" and "DATA 5" are combined and processed as 8-bit data, as shown in FIG. 16. The port for reading out the SW input state, designated by "DATA 1", contains eight terminals (No. 0 to 7). The above combined "DATA 4" and "DATA 5" are supplied with a high level/a low level state of each of eight terminals (No. 0 to 7). "DATA 6" and "DATA 7" are likewise supplied with a high level/a low state of eight terminals of the port designated by "DATA 2". "DATA 8" and "DATA 9" are processed likewise, relative to the port designated by "DATA 3", as shown in FIG. 16.

For each combined "DATA 4" and "DATA 5", "DATA 6" and "DATA 7", and "DATA 8" and "DATA 9", terminals No. 0 and No. 7 correspond respectively to the lowest level bit and the highest level bit. For instance, when only terminal No. 0 of port No. 1 ("0001"), terminal No. 1 of port No. 2 ("0010") and terminal No. 2 of port No. 3 ("0011") are in the high level state, "DATA 1", "DATA 2" and "DATA 3" in the response signals 14 are respectively stored with "0001", "0010" and "0011", so that three port numbers are designated. At the same time, the combined 8-bit data for "DATA 4" and "DATA 5", "DATA 6" and "DATA 7" and "DATA 8" and "DATA 9" are respectively supplied with 8-bit data "0000 0001", "0000 0010" and "0000 0011".

Figure 17:
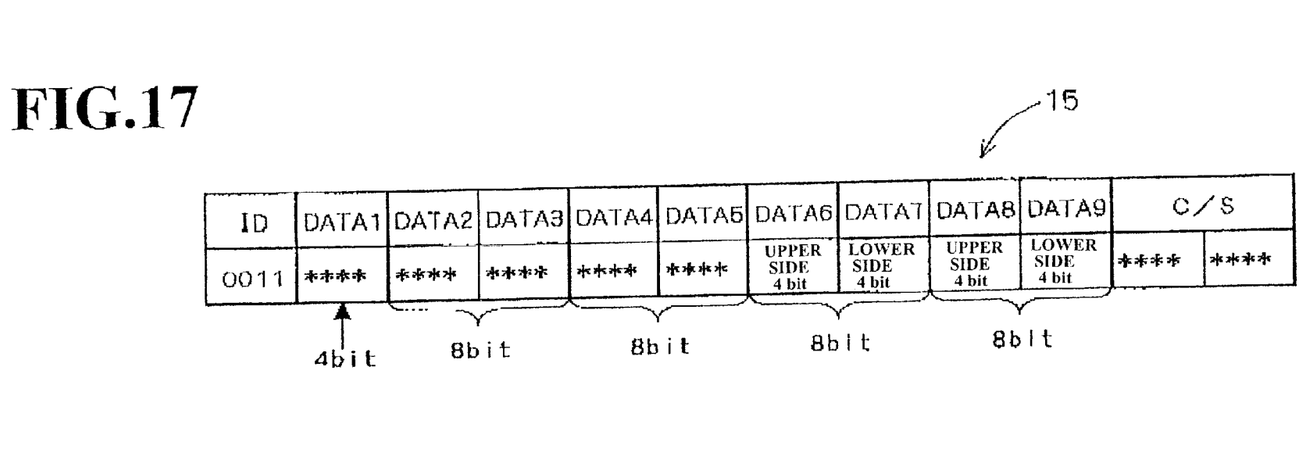
FIG. 17 shows a format for response signal for reading-out the data from A/D ports according to the present invention.

When reading out the A/D port data ("ID" is "0011" in Table 2), "DATA 1" in the response signals 15 contains 4 bit data designating the number for the port for reading out the A/D values, as shown in FIG. 17. "DATA 2" and "DATA 3" are combined and processed as 8-bit data. The latter form a flag for designating one of the terminals contained in the port for reading out the A/D values, the port being designated by "DATA 1". "DATA 4" and "DATA 5" are likewise combined and processed as 8-bit data, and form a flag for designating another terminal in the port for reading out the A/D values, the port being designated by "DATA 1". These "DATA 2" to "DATA 5" in the response signals 15 correspond to "DATA 2" to "DATA 5" in the order signals 12 of FIG. 13.

"DATA 6" and "DATA 7" are also combined and processed as 8-bit data. "DATA 1" designates a port for reading out the A/D values. "DATA 2" and "DATA 3" in this port contain 8-bit data, designating 8-bit terminals for reading out the A/D values. "DATA 6" and DATA 7" are then supplied with 8-bit A/D values read-out from the above terminals. Further, "DATA 8" and "DATA 9" are likewise combined and processed as 8-bit data. "DATA 1" designates a port for reading out the A/D values. "DATA 4" and "DATA 5" in this port contain 8-bit data designating 8-bit terminals for reading out the A/D values. "DATA 8" and DATA 9" are then supplied with 8-bit A/D values read-out from the above terminals.

Figure 18:
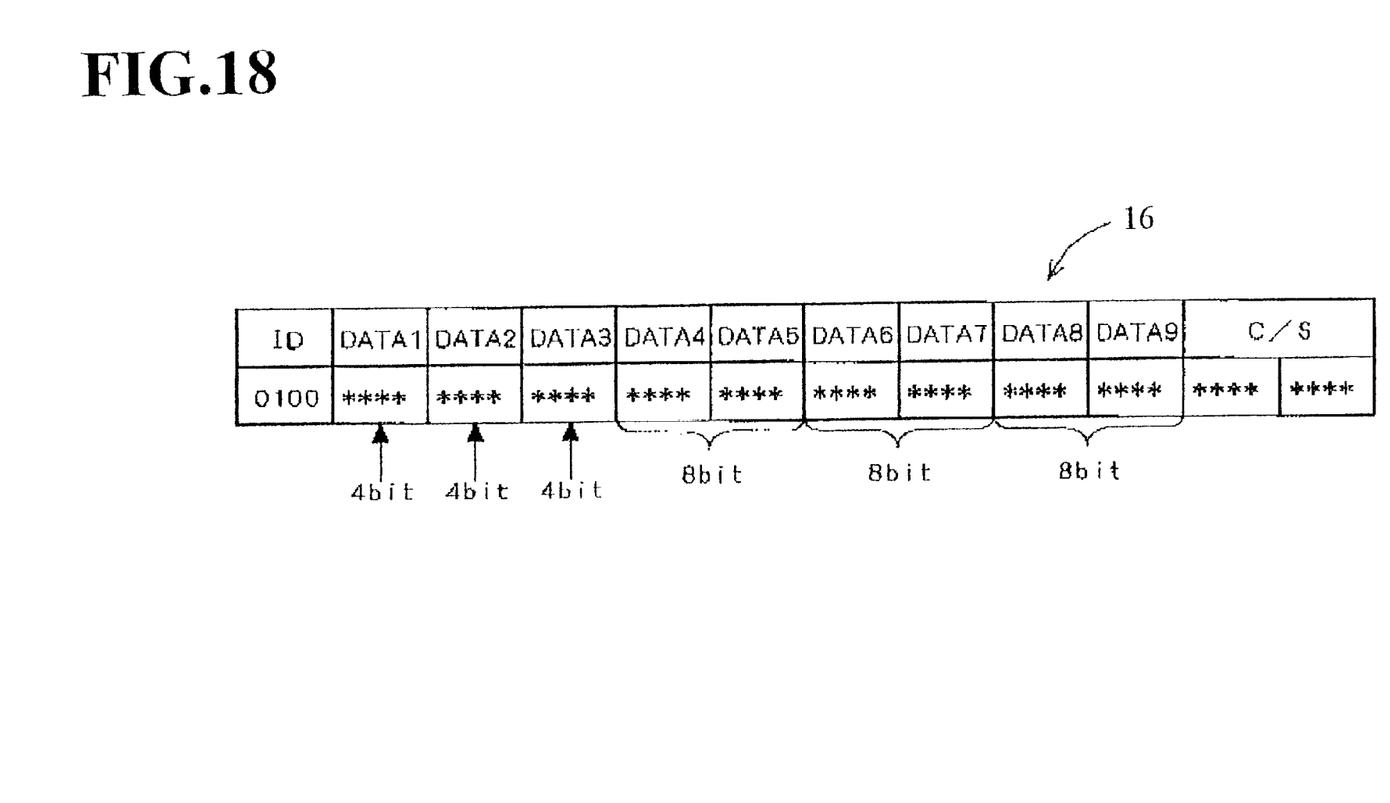
FIG. 18 shows a format for response signal for writing-in the output from common ports according to the present invention.

When writing in the output from common ports (when "ID" is "0100" in Table 2), "DATA 1" to "DATA 3" in the response signals of FIG. 15(b) signify three 4-bit data, each designating the number of ports for writing in the output, as shown in the response signals 16 of FIG. 18. "DATA 1" to "DATA 3" correspond to those in the order signals 13 of FIG. 14. Further, "DATA 4" and "DATA 5" are combined and processed as 8-bit data as shown in FIG. 18. "DATA 1" designates a port for writing in the output. "DATA 4" and "DATA 5" are then supplied with a port output content in 8 bits, which has been written into the above designated port, and read out therefrom. These 8-bit data are designed to check whether the outputted data are the same as those in "DATA 4" and "DATA 5" in the order signal 13 of FIG. 14. "DATA 6" and "DATA 7" are likewise combined and processed as 8-bit data, as shown in FIG. 18. "DATA 2" designates a port for writing in the output. "DATA 6" and "DATA 7" are then supplied with a port output content in 8 bits, which has been written into the above designated port and read out therefrom. In the same manner, "DATA 8" and "DATA 9" are combined and processed as 8-bit data, as shown in FIG. 18. "DATA 3" designates a port for writing in the output. "DATA 8" and "DATA 9" are then supplied with a port output content in 8 bits, which has been written into the above designated port and read out therefrom.

Item "C/S" in FIGS. 15 to 18 signify check sum data. "ID" and "DATA 1", "DATA 2" and "DATA 3", "DATA 4" and "DATA 5", "DATA 6" and "DATA 7", and "DATA 8" and "DATA 9" in the response signals 14 to 16 are respectively combined to form respective 8 bit data. All these 8 bit data are added, and the lowest 8 bit data (i.e. excluding higher figures which overflow from the sum) are obtained. "CS" is then supplied with these data.

The response signals 14 to 16 are supplied from the electronic unit 1 to the test device 3 through periodic communications. The response signals are checked in the test device 3, to determine whether they contain relevant response contents which correspond to the order contents given in the order signals 11 to 13.

Figure 19:
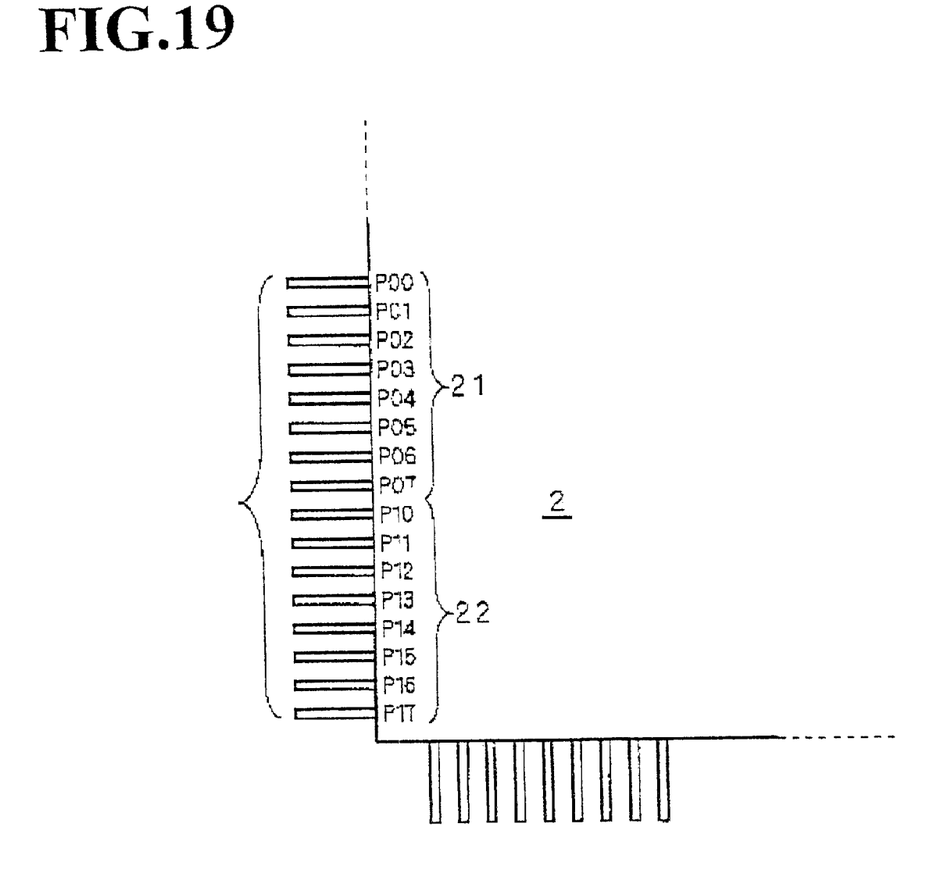
FIG. 19 is a partial top plan view of a microcomputer chip including ports and terminals.

As schematized in FIG. 19, the microcomputer chip 2 in the electronic unit 1 used in the present test system contains several ports 21, 22, each of which includes eight terminals P00 to P17.

<Mode for Reading out SW Input Data from Common Ports>

The test device shown in FIG. 1 performs, before its shipment, testing of the electronic unit 1 to be loaded in a vehicle. During this testing, order signals are put on periodic communications running at a periodicity of 200 ms (see FIG. 2).

An order content is contained in item "ID" (Table 2) in an order signal and then transmitted. Each "ID" has a 4-bit length.

When reading out SW input data from a common port, the electronic unit 1 is supplied with "ID" data "0010" as an order signal 11 (Table 2, FIG. 12). At the same time, "DATA 1" to "DATA 3" in the same order signal 11 are supplied with three corresponding 4-bit data, respectively designating a port for reading out the SW input state. "DATA 4" to "DATA 9" are supplied with a digit "0" in all of their bits. Further, signal "C/S" is supplied with check sum data. The order signal 11 thus includes a fixed length of 48 bits, and is transmitted periodically. Accordingly, one frame of order signal 11 contains orders for reading out SW input data from three common ports for reading out the SW input state.

The microcomputer chip 2 receives such an order signal 11 through an IG input circuit 4, and produces a response signal 14 (FIG. 16) in reply thereto.

As shown in FIG. 16, "ID" and "DATA 1" to "DATA 3" in the response signal 14 are supplied with the same data as those in "ID" and "DATA 1" to "DATA 3" in the order signal 11 of FIG. 12.

Further, "DATA 4" and "DATA 5" are combined and processed as 8-bit data, as shown in FIG. 16. As mentioned above, "DATA 1" designates a port for reading out the SW input state. This port contains eight terminals having No. 0 to 7. The high level/low level state of each of these eight terminals are then supplied bit by bit in the combined DATA 4 and 5. Further yet, "DATA 6" and "DATA 7" are combined and processed as 8-bit data. They are supplied bit by bit with the high level/low level state of each of eight terminals No. 0 to No. 7 in the SW input state reading-out port designated by "DATA 2" (FIG. 16). Furthermore, "DATA 8" and "DATA 9" are combined and processed as 8-bit data. They are supplied, bit by bit, with the high level/low level state of each of eight terminals No. 0 to No. 7 in the SW input state reading-out port designated by "DATA 3" (FIG. 16). Further, "C/S" is supplied with check sum data. The response signal 14 thus includes a fixed length of 48 bits, and is periodically transmitted to the test device 3. One frame of the response signal 14 can thus contain the results of data reading-out from three common ports for reading out the state on SW input.

In the periodic communications at a frequency of 200 ms, one frame of respective order and response signal allows performance of a test for reading-out of SW input data for three common ports. The processing speed is thus tripled compared to the past, and the test and processing time for the car-borne electronic unit can be greatly reduced.

<Mode for Reading out the A/D Port Data>

When reading out the A/D port data in the test device 3, "ID" in the order signal 12 is supplied with digits "0011" (see Table 2), while "DATA 1" is supplied with 4-bit data designating a port number for reading out the A/D value (FIG. 13). "DATA 2" and "DATA 3" are combined and processed as 8-bit data. "DATA 1" designates a port for reading out the A/D value. Any one of the terminals of the designated port supra is then designated. "DATA 4" and "DATA 5" are also combined and processed as 8-bit data. They are supplied with a flag for another terminal of the port designated by "DATA 1". Conversely, all the bits in "DATA 6" to "DATA 9" are supplied with a digit "0". Such an order signal 12 is periodically sent from the test device to the electronic unit 1 for car loading.

In the above case, one frame of order signal 12 contains an order for reading out the A/D port data for two terminals.

The microcomputer chip 2 receives such an order signal 12 via the IG input circuit 4, and produces a response signal 15 in reply thereto.

As shown in FIG. 17, "ID" and "DATA 1" to "DATA 5" in the response signal 15 are supplied with the same data as those in the corresponding order signal 12 (FIG. 13).

Conversely, "DATA 6" and "DATA 7" are combined and processed as 8-bit data. "DATA 1" designates a port for reading out the A/D value, and "DATA 2" and "DATA 3" designate, by flag, a terminal for reading out the A/D values. The combined "DATA 6" and "DATA 7" are then supplied with 8-bit A/D read-out values for the above terminal. Likewise, "DATA 8" and "DATA 9" are combined and processed as 8-bit data. "DATA 1" designates a port for reading out the A/D values, and "DATA 4" and "DATA 5" designate another terminal in the designated port. The combined "DATA 8" and "DATA 9" are then supplied with 8-bit A/D read-out values for the above terminal.

Further, "C/S" is supplied with check sum data. The fixed length of 48 bits thus obtained are periodically sent back to the test device in a response signal 15. In this manner, one frame of response signal 15 allows A/D port data to be read out from two terminals in one A/D value read-out port.

Accordingly, in one frame of order signal 12 and one frame of response signal 15 in a periodic communication at a frequency of 200 ms, the A/D values are read out from two terminals and tested. The processing speed is thus doubled compared to the past processing practice, and the testing time for a vehicle mounted electronic unit is greatly reduced.

<Mode for Writing-in the Output from Common Ports>

When writing-in the output from common ports, an order signal 13 of FIG. 14 in the test device 3 contains "ID" with digits "0100" (see Table 2).

Meanwhile, "DATA 1" to "DATA 3" are supplied with three 4-bit data, respectively designating a port number for writing-in the output. As shown in FIG. 14, "DATA 4" and "DATA 5" are combined and processed as 8-bit data. They are then supplied with a 8-bit length port output content which is intended to be written into the port for writing-in the output, the port being designated by "DATA 1". Likewise, "DATA 6" and "DATA 7" are combined and processed as 8-bit data, and they are then supplied with a 8-bit length port output content which is intended to be written into the port for writing-in the output, the port being designated by "DATA 2". Further, "DATA 8" and "DATA 9" are combined and processed as 8-bit data, and they are then supplied with a 8-bit length port output content which is intended to be written into the port for writing-in the output, the port being designated by "DATA 3". Meanwhile, "C/S" is supplied with check sum data. All these data are periodically communicated to the vehicle mounted electronic unit 1.

Therefore, one frame of order signal 13 is designed to contain an order for writing-in the output from three common ports.

The order signal 13 is entered in the car-loading electronic unit 1, and inputted into the microcomputer chip 2 via the IG input circuit 4.

The microcomputer chip 2 produces a response signal 16 shown in FIG. 18, in reply to the order signal. In that process, "ID" and "DATA 1" to "DATA 3" in the response signal 16 are supplied with the same corresponding data as those in the order signal 13 shown in FIG. 14.

As in the case of order signal, "DATA 4" and "DATA 5" are combined and processed as 8-bit data, as shown in FIG. 18. They are then supplied with a 8-bit length port output content, which was first written into the output writing-in port designated by "DATA 1", and then read out therefrom. "DATA 6" and "DATA 7" are also processed as above, and supplied with a 8-bit length port output content, which was first written in to the output writing-in port designated by "DATA 2", and then read out therefrom. "DATA 8" and "DATA 9" are likewise processed, and are supplied with a 8-bit length port output content, which was first written in to the output writing-in port designated by DATA 3, and then read out therefrom.

Further, "C/S" is supplied with check sum data. A fixed length of 48 bits is periodically communicated to the test device 3 as a response signal 16. The test device 3 examines whether "DATA 4" to "DATA 9" in the order signal 13 of FIG. 14 prepared by this machine, on one hand, and "DATA 4" to "DATA 9" in the response signal 16 of FIG. 18 transmitted by the car-loading electronic unit 1 on the other, are the same.

In this case, one frame of response signal 16 can contain information on the output writing-in result for three output writing-in ports.

Accordingly, by communicating one frame of order signal 13 and of response signal 16 at a frequency of 200 ms, a test for writing-in the output from common ports can be performed for three ports. As a result, the processing speed is tripled compared to the prior art, and the testing time for an electronic unit mounted in a vehicle can be reduced greatly.

In the above embodiments, one frame of order signal 11, 12 or 13 and one frame of response signal 14, 15 or 16 respectively have a fixed length longer than that in the prior art (see FIGS. 11 to 15). However, as the above frame is sent and returned by one cycle, its length has no significant meaning. By contrast, as shown in Table 3 below, the above frame can increase the number of ports for reading out the input state of switch by three, the number of ports for writing-in the output from common ports by three, and the number of terminals for reading-out the value from A/D ports by two. The testing time is thus greatly reduced.

TABLE 3

| | Prior art | Invention |
|---|---|---|
| Reading-out the input state on SW from common ports | 1 port | 3 ports |
| Writing-in the output from common ports | 1 port | 3 ports |
| Reading-out the value from A/D ports | 1 terminal | 2 terminals |

According to a first embodiment of the invention, the data length of at least part of data is shortened to 4 bits. By virtue of this configuration, one frame of order signal, transmitted periodically from a vehicle mounted electronic unit to a controller unit, can carry data designating an increased number of ports and terminals. The order signal is then processed by the controller unit. The processed results are loaded on a response signal and returned to the electronic unit and the test device. In this manner, several ports and several terminals can be processed and tested in a cycle of periodic communications. Compared to the prior art where only a single port or a single terminal could be tested in one cycle, the present invention can greatly reduce the test time.

According to another embodiment of the invention, the response signal contains the same data as the order signal, as to the data for the order contents, as well as the data for designating the ports and terminals. In this manner, data efficiency is improved, not only for the order signal, but also for the response signal.

Although the invention has been described with reference to particular means, materials and embodiments, it is to be understood that the invention is not limited to the particulars disclosed and extends to all equivalents within the scope of the claims.

The present disclosure relates to subject matter contained in priority Japanese Application No. 2000-225268, filed on Jul. 26, 2000, which is herein expressly incorporated by reference in its entirety.

What is claimed:

1. A method of testing an electronic unit mounted in a vehicle, the method utilizing a test device and a controller unit included in the electronic unit, an order signal being supplied from the test device to the controller unit, and processed therein to give processed results, the processed results being returned from the controller unit to the test device as a response signal, said method comprising:

providing, in said test device, first data designating several ports and several terminals contained in said controller unit, as well as second data instructing an order content relative to each of said ports and terminals, and providing said first and second data in a frame of an order signal, thereby formulating an order signal containing order contents;

periodically transmitting said order signal from said test device to said controller unit, frame by frame, at a given frequency;

processing said order contents corresponding to each of said ports and terminals contained in said order signal, when said order signal is received by said controller unit, thereby obtaining processed results;

providing, in said controller unit, said processed results for each of said ports and terminals in a frame of a response signal; and periodically returning said response signal from said controller unit to said test device, frame by frame, at said given frequency;

wherein at least one of said first data and said second data have a data length of 4 bits such that one processing cycle of transmitting said order signal and returning said response signal accommodates several ports and several terminals, and overall processing time is decreased.

2. The method according to claim 1, wherein said second data have a data length of 4 bits.

3. The method according to claim 1, wherein said first data have a data length of 4 bits.

4. The method according to claim 2, wherein said first data have a data length of 4 bits.

5. The method according to claim 1, wherein said providing said first and second data comprises providing an order signal containing third data, having a data length of 4 bits, designating a single port and several terminals, as well as fourth data instructing an order content relative to each of said terminals, and said providing said first and second data further comprises providing said third and fourth data in a frame of said order signal.

6. The method according to claim 2, wherein said providing said first and second data comprises providing an order signal containing third data designating a single port and several terminals, as well as fourth data instructing an order content relative to each of said terminals, said providing said first and second data further comprises providing said third and fourth data in a frame of said order signal, and said third data designating said single port having a data length of 4 bits.

7. The method according to claim 3, wherein said providing said first and second data comprises providing an order signal containing third data designating a single port and several terminals, as well as fourth data instructing an order content relative to each of said terminals, said providing said first and second data further comprises providing said third and fourth data in a frame of said order signal, and said third data designating said single port having a data length of 4 bits.

8. The method according to claim 4, wherein said providing said first and second data comprises providing an order signal containing third data designating a single port and several terminals, as well as fourth data instructing an order content relative to each of said terminals, said providing said first and second data further comprises providing said third and fourth data in a frame of said order signal, and said third data designating said single port having a data length of 4 bits.

9. The method according to claim 1, wherein said providing said processed results comprises providing a response signal containing the same data as said first and second data in said order signal.

10. The method according to claim 3, wherein said providing said processed results comprises providing a response signal containing the same data as said first and second data in said order signal.

11. The method according to claim 5, wherein said providing said processed results comprises providing a response signal containing the same data as said first and second data in said order signal.

12. A system for testing an electronic unit mounted in a vehicle, the system containing a test device and a controller unit included in the electronic unit, an order signal being supplied from the test device to the controller unit, and processed therein to give processed results, the processed results being returned from the controller unit to the test device as a response signal, said system comprising:

a first device that provides, in said test device, first data designating several ports and several terminals contained in said controller unit, as well as second data instructing an order content relative to each of said ports and terminals, and that provides said first and second data in a frame of an order signal, such as to formulate an order signal containing order contents;

a transmitter that periodically transmits said order signal from said test device to said controller unit, frame by frame, at a given frequency;

a processor that processes said order contents corresponding to each of said ports and terminals contained in said order signal, when said order signal is received by said controller unit, such as to obtain processed results;

a second device that provides, in said controller unit, said processed results for each of said ports and terminals in a frame of a response signal; and a third device that periodically returns said response signal from said controller unit to said test device, frame by frame, at said given frequency;

wherein at least one of said first data and said second data have a data length of 4 bits such that one processing cycle of transmitting said order signal and returning said response signal accommodates several ports and several terminals, and overall processing time is decreased.

13. The system according to claim 12, wherein said second data in said first device have a data length of 4 bits.

14. The system according to claim 12, wherein said first data in said first device have a data length of 4 bits.

15. The system according to claim 13, wherein said first data in said first device have a data length of 4 bits.

16. The system according to claim 12, wherein said first device comprises an order signal provider that provides an order signal containing third data, having a data length of 4 bits, designating a single port and several terminals, as well as fourth data instructing an order content relative to each of said terminals, and said order signal provider further comprises a signal provider that provides said third and fourth data in a frame of said order signal.

17. The system according to claim 14, wherein said first device comprises an order signal provider that provides an order signal containing third data, having a data length of 4 bits, designating a single port and several terminals, as well as fourth data instructing an order content relative to each of said terminals, and said order signal provider further comprises a signal provider that provides said third and fourth data in a frame of said order signal.

18. The system according to claim 12, wherein said second device comprises a response signal provider that provides a response signal containing the same data as said first and second data in said order signal.

19. The system according to claim 14, wherein said second device comprises a response signal provider that provides a response signal containing the same data as said first and second data in said order signal.

20. The system according to claim 16, wherein said second device comprises a response signal provider that provides a response signal containing the same data as said first and second data in said order signal.

* * * * *